(12) United States Patent
Schaefer et al.

(10) Patent No.: US 12,089,352 B2
(45) Date of Patent: Sep. 10, 2024

(54) PRESSURE EQUALISING DEVICE AND HOUSING COMPRISING THE PRESSURE EQUALISING DEVICE

(71) Applicant: Carl Freudenberg KG, Weinheim (DE)

(72) Inventors: Christopher Schaefer, Ober-Ramstadt (DE); Ingo Stephan, Rimbach (DE); Markus Filler, Grasellenbach (DE)

(73) Assignee: CARL FREUDENBERG KG, Weinheim (DE)

( * ) Notice: Subject to any disclaimer, the term of this patent is extended or adjusted under 35 U.S.C. 154(b) by 0 days.

(21) Appl. No.: 18/263,893

(22) PCT Filed: Jan. 18, 2022

(86) PCT No.: PCT/EP2022/050965
§ 371 (c)(1),
(2) Date: Aug. 2, 2023

(87) PCT Pub. No.: WO2022/167212
PCT Pub. Date: Aug. 11, 2022

(65) Prior Publication Data
US 2024/0040716 A1    Feb. 1, 2024

(30) Foreign Application Priority Data
Feb. 3, 2021   (DE) .................. 10 2021 102 444.7

(51) Int. Cl.
*B01D 39/16*      (2006.01)
*B01D 46/54*      (2006.01)
(Continued)

(52) U.S. Cl.
CPC ....... *H05K 5/0213* (2013.01); *B01D 39/1623* (2013.01); *B01D 39/1692* (2013.01);
(Continued)

(58) Field of Classification Search
CPC .... B01D 2239/0233; B01D 2239/0216; B01D 2239/0618; B01D 2239/065;
(Continued)

(56) References Cited

U.S. PATENT DOCUMENTS

| 5,914,415 A | 6/1999 | Tago |
| 2002/0031628 A1 | 3/2002 | Zumbrum et al. |

(Continued)

FOREIGN PATENT DOCUMENTS

| DE | 69723932 T2 | 2/2004 |
| DE | 69932595 T2 | 8/2007 |

(Continued)

*Primary Examiner* — Timothy J Thompson
*Assistant Examiner* — Guillermo J Egoavil
(74) *Attorney, Agent, or Firm* — LEYDIG, VOIT & MAYER, LTD.

(57) ABSTRACT

A pressure equalising device for a housing, including an inside, an outside, and a lattice-like cage having a gas passage opening. The gas passage opening connects the inside and the outside in a differential pressure-dependent and flow-conducting manner. The gas passage opening is covered by a gas-permeable membrane which includes at least one nonwoven layer. The nonwoven layer includes fibers which are substantially completely sheathed by a sheath of an elastomer.

16 Claims, 2 Drawing Sheets

(51) Int. Cl.
*B32B 5/02* (2006.01)
*B32B 5/26* (2006.01)
*B32B 27/12* (2006.01)
*B32B 27/32* (2006.01)
*F16K 24/04* (2006.01)
*F21S 45/30* (2018.01)
*H01M 50/30* (2021.01)
*H05K 5/02* (2006.01)

(52) U.S. Cl.
CPC ............ *B01D 46/543* (2013.01); *B32B 5/022* (2013.01); *B32B 5/266* (2021.05); *B32B 27/12* (2013.01); *B32B 27/322* (2013.01); *B01D 2239/0216* (2013.01); *B01D 2239/0618* (2013.01); *B01D 2239/065* (2013.01); *B01D 2239/1258* (2013.01); *B01D 2279/45* (2013.01); *B32B 2250/02* (2013.01); *B32B 2307/724* (2013.01); *B32B 2457/00* (2013.01)

(58) Field of Classification Search
CPC ........ B01D 2239/1258; B01D 2279/45; B01D 39/1692; B01D 39/1623; B01D 39/16; B01D 46/543; B32B 5/266; B32B 5/022; B32B 27/12; B32B 27/322; B32B 2250/02; B32B 2307/724; B32B 2457/00; F16K 15/148; F16K 17/02; F16K 24/04; F16K 24/00; F16K 31/126; F21S 45/30; H01M 50/308; H01M 50/394; H01M 50/30; H01M 50/325; H05K 5/0213; H05K 5/0216; H05K 5/02; Y02E 60/10
USPC ........................................ 361/679.1; 137/854
See application file for complete search history.

(56) References Cited

U.S. PATENT DOCUMENTS

| | | | |
|---|---|---|---|
| 2013/0032219 | A1 | 2/2013 | Heim et al. |
| 2014/0154496 | A1* | 6/2014 | Sang .................. B32B 5/26 156/196 |
| 2018/0292020 | A1* | 10/2018 | Kleinke ................ F16K 31/126 |
| 2018/0299239 | A1* | 10/2018 | Eitschberger .......... H05K 5/069 |
| 2021/0396324 | A1 | 12/2021 | Nakayama et al. |
| 2022/0349119 | A1* | 11/2022 | Prissok .................. B01D 69/12 |

FOREIGN PATENT DOCUMENTS

| | | | | |
|---|---|---|---|---|
| DE | 102015217112 | A1 | 3/2017 | |
| DE | 102017003360 | B3 | 7/2018 | |
| DE | 112019005336 | T5 | 7/2021 | |
| EP | 1939523 | A1 | 7/2008 | |
| EP | 2503199 | A1 * | 9/2012 | ............... F16J 13/24 |
| EP | 2554882 | A1 | 2/2013 | |
| GB | 2543638 | A | 4/2017 | |

* cited by examiner

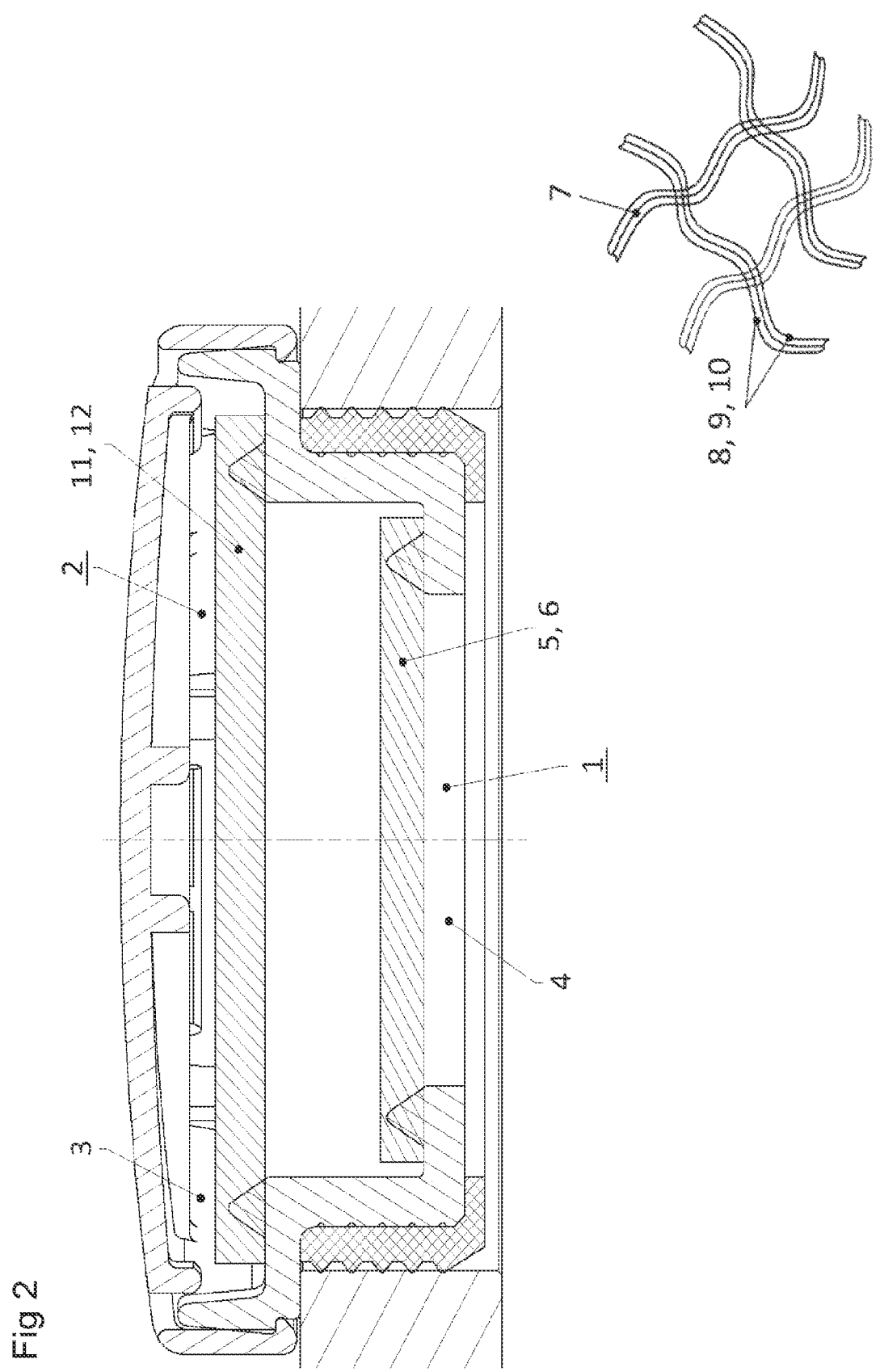

PRESSURE EQUALISING DEVICE AND HOUSING COMPRISING THE PRESSURE EQUALISING DEVICE

CROSS REFERENCE TO RELATED APPLICATIONS

This application is a U.S. National Phase application under 35 U.S.C. § 371 of International Application No. PCT/EP2022/050965, filed on Jan. 18, 2022, and claims benefit to German Patent Application No. DE 10 2021 102 444.7, filed on Feb. 3, 2021. The International Application was published in German on Aug. 11, 2022 as WO 2022/167212 A1 under PCT Article 21(2).

FIELD

The invention relates to a pressure equalising device and to a housing comprising the pressure equalising device.

BACKGROUND

A pressure equalising device is known from DE 10 2017 003 360 B3. The membrane is assigned a pressure relief valve designed as a burst protection means in a functional parallel configuration, ensuring that the membrane survives emergency degassing of the inside undamaged and can then continue to be used unchanged in the pressure equalising device.

Another pressure equalising device is known from EP 2 503 199 A1. The previously known pressure equalising device is used for a housing having a dead volume and comprises an open-pored element which has an average pore diameter of 2 to 100 µm, preferably 5 to 50 µm. The open-pored element can be protected against mechanical loads by a protective element, wherein the protective element is formed, for example, by a protective film. The protective film can be open-pored or closed, depending on the particular circumstances of the application. A closed protective film is used, for example, as a transport protection means and is removed from the open-pored element before the pressure equalising device is put into operation. In contrast, an open-pored protective film can remain on the open-pored element and protects it from coarse contamination during the intended use of the pressure equalising device.

EP 2 554 882 A1 discloses a further pressure equalising device for equalising an internal pressure in a housing, wherein an electrochemical device is arranged within the housing. The gas-permeable membrane is deformable in accordance with changes in the internal pressure and consists of a PTFE material. The membrane normally allows pressure equalisation between the inside and the outside. In the event of an undesirably excessive internal pressure in the housing, the membrane is destroyed by a spike designed as an emergency degassing element and must then be replaced by an undamaged membrane for continued operation of the pressure equalising device.

In general, pressure equalising devices are provided in order to avoid excessively high pressure differences between the inside and the outside of a housing, which could lead to an undesirably high mechanical load on the housing, in the extreme case to its destruction or to the failure of components arranged inside the housing.

In addition to maintaining the air throughput for pressure equalisation, the pressure equalising device must likewise protect the interior of the housing from the penetration of moisture from the environment.

If liquid media, such as oil, are located on the inside of the pressure equalising device, that is to say in the interior of the housing, it is also necessary to prevent the oil from passing from the inside through the pressure equalising device to the outside and thus into the environment.

For this purpose, the current practice is generally to use porous PTFE membranes, which function well in the new condition, i.e. allow good pressure equalisation, while preventing oil located in the interior of the housing from escaping into the environment. However, with increasing service life of such a PTFE membrane, the pores of the PTFE membrane become clogged by the oil. Consequently, the air throughput through the PTFE membrane decreases and the pressure difference between the inside and outside increases to an undesirable degree.

Alternatively, no pressure equalisation valves are used, but simply ventilation ducts equipped with a labyrinth to counter the direct ingress of water and dirt or the escape of oil.

SUMMARY

In an embodiment, the present disclosure provides a pressure equalising device for a housing, comprising an inside, an outside, and a lattice-like cage having a gas passage opening. The gas passage opening connects the inside and the outside in a differential pressure-dependent and flow-conducting manner. The gas passage opening is covered by a gas-permeable membrane which comprises at least one nonwoven layer. The nonwoven layer comprises fibers which are substantially completely sheathed by a sheath of an elastomer.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 2 shows an exemplary embodiment, in which a further nonwoven layer is assigned to the membrane.

DETAILED DESCRIPTION

Figure 1:
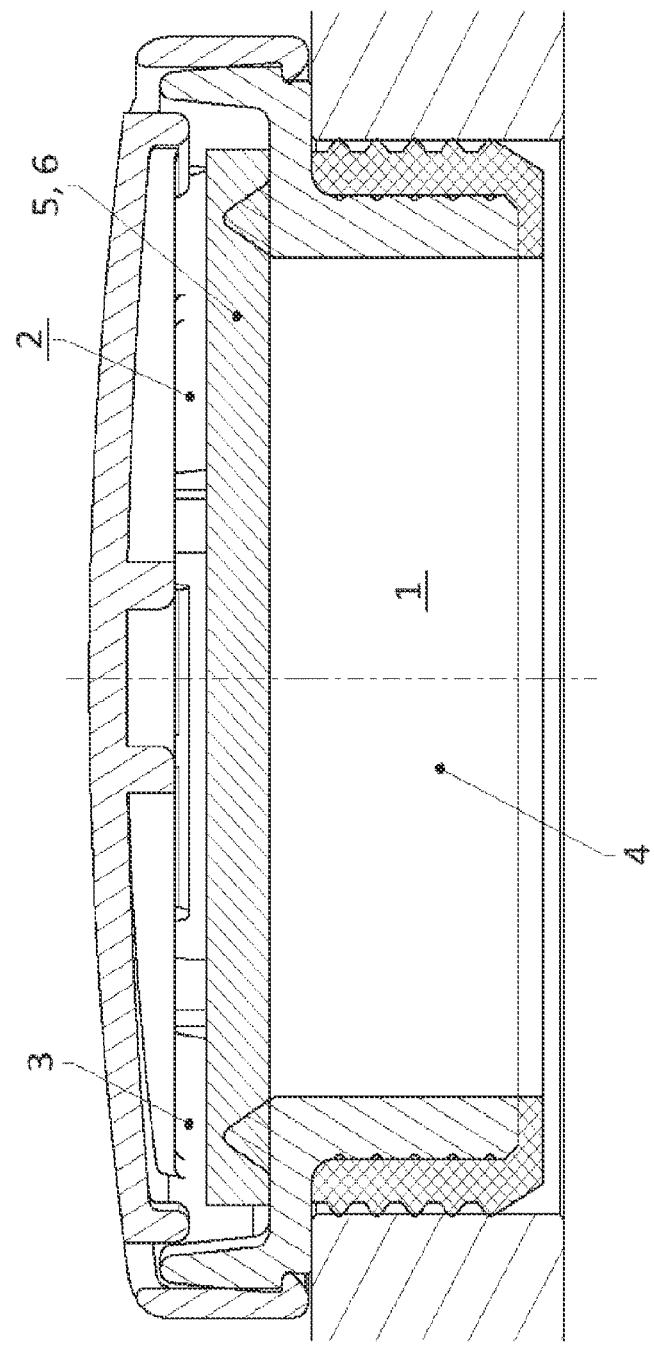
FIG. 1 shows an exemplary embodiment, in which a gas-permeable membrane comprises only a nonwoven layer, with fibers which are sheathed by a sheath consisting of an elastomer.

In an embodiment, the present invention provides a pressure equalising device that avoids the aforementioned disadvantages, and in particular provides a gas-permeable membrane that has consistently good service properties during a long service life. The membrane is intended to ensure good pressure equalisation in the long term and at the same time to prevent oil leakage from the inside to the outside over a large temperature range or to reduce it to required minima.

In an embodiment, a nonwoven layer comprising fibers which are substantially completely sheathed by a sheath of an elastomer is provided.

It has been found that the elastomer sheath of the fibers is oil-repellent. These oil-repellent properties of the sheath effectively prevent or greatly reduce the escape of oil. The oil can be present in various states, for example as oil droplets, oil vapor, oil mist or as an oil column.

According to an advantageous embodiment, provision can be made for the elastomer to be formed by a fluoroelastomer (FKM) blend. In general, all elastomers which have oil-repellent properties can be used. However, an FKM blend is particularly advantageous because such a blend is resistant to high temperatures, and therefore the pressure equalising device can also be operated in a large temperature range, preferably from −40° C. to +150° C. All customary temperature ranges are covered thereby.

The sheath of elastomer can be formed by an elastomer impregnation. By virtue of the elastomer impregnation, substantially complete sheathing of the fibers is achieved, on the one hand, and a high air permeability of the membrane is substantially maintained, on the other hand.

The membrane is impregnated by a dipping process, which ensures uniform application and complete sheathing of the fibers. By adjusting the concentration in the dipping bath and the number of passes, the coating thickness can be set very precisely.

Following the elastomer impregnation, the sheath is dried or vulcanized around the fibers, and therefore the sheath is vulcanized around the fibers in the ready-to-use gas-permeable membrane. The sheath is therefore particularly tough and durable, ensuring that the membrane retains its original service properties in the new condition for a very long service life.

The fibers used are long and arranged horizontally. Such an embodiment is advantageous for an oleophobic surface.

The nonwoven layer has a constant air permeability, preferably over the entire temperature range from −40° C. to +150° C. In this large temperature range, the pressure equalising device therefore always functions consistently well.

Depending on the respective circumstances of the use case, provision can be made for the nonwoven layer and a further nonwoven layer to be arranged in a functional in-series configuration and to form a subassembly.

The further nonwoven layer can be designed as a laminate of nonwoven and expanded polytetrafluoroethylene (ePTFE). Such a laminate acts as a barrier layer and in all cases reliably prevents liquid from penetrating from the outside to the inside through the membrane.

The further nonwoven layer can be provided in order to prevent water from entering from the outside through the gas passage opening to the inside. For this purpose, the further nonwoven layer can be arranged on the side of the nonwoven layer which faces the outside. The nonwoven layer and the further nonwoven layer preferably form a preassembled unit. The nonwoven layer and the further nonwoven layer are preferably of substantially congruent design and form a nonwoven composite part.

In addition, an embodiment of the invention relates to a housing having a pressure equalising device as described above.

The housing preferably encloses oil-filled components, for example transmissions, transformers or electric motors.

BRIEF DESCRIPTION OF THE DRAWING

Two exemplary embodiments of a pressure equalising device according to the invention are explained in more detail below with reference to the schematically illustrated FIGS. 1 and 2.

The pressure equalising devices can be used for all types of housings in which unwanted differential pressures between the inside 1 and the outside 2 are to be avoided. The pressure equalising devices have an inside 1 and an outside 2, wherein the pressure from the interior of a housing acts on the inside 1 and the ambient pressure, usually atmospheric pressure, acts on the outside 2 of the gas-permeable membrane 5.

The pressure equalising devices each comprise a lattice-like cage 3 having the gas passage opening 4, which connects the inside 1 and the outside 2 in a flow-conducting manner as a function of the differential pressure acting on the membrane 5. In both exemplary embodiments, the membrane 5 comprises the porous nonwoven layer 6. The fibers 7 of the nonwoven layer 6 are substantially completely sheathed by the sheath 8 of elastomer 9.

In order to be able to operate the pressure equalising device reliably in a large temperature range, for example from −40° C. to +150° C., the elastomer 9 in the exemplary embodiments shown here consists in each case of an FKM blend.

FIG. 1 shows a first exemplary embodiment, in which the gas-permeable membrane comprises only the nonwoven layer 6, the fibers 7 of which are sheathed by the sheath 8 consisting of the elastomer 9.

FIG. 2 shows a further exemplary embodiment, which differs from the exemplary embodiment from FIG. 1 in that the gas-permeable membrane 5 is assigned the further nonwoven layer 11.

The nonwoven layer 6 is arranged on the side of the membrane 5 which faces the inside 1 and the further nonwoven layer 11 is arranged on the side of said membrane which faces the outside 2. The further nonwoven layer 11 is designed as a laminate 12 of nonwoven and ePTFE.

In both exemplary embodiments, the nonwoven layer 6 with the fibers 7 sheathed by the sheath 8 of elastomer 9 ensures that oil in its various states is retained on the inside 1, as required, and does not penetrate the gas-permeable membrane 5 in the direction of the outside 2 and thus enter the environment and contaminate it. The elastomer impregnation 10 of the nonwoven layer 6 prevents oil from sticking in the pores of the nonwoven layer 6. Air permeability and thus the function of pressure equalisation between the inside 1 and the outside 2 are thereby ensured at all times.

In FIG. 2, the further nonwoven layer 11 is additionally provided, which is designed as a laminate 12 of nonwoven and ePTFE. This further nonwoven layer 11 prevents the nonwoven layer 6 from being undesirably exposed to large amounts of liquid from the outside 2, which could then penetrate to the inside 1 under unfavorable circumstances.

In the normal case, the further nonwoven layer 11 has no effect on the service properties of the pressure equalising device.

The laminate 12 of nonwoven and ePTFE is used if, in addition to oil repellency with respect to the inside, waterproofness with respect to the outside is also required.

The pressure equalising device according to an embodiment of the invention prevents oil from escaping from the inside 1 through the gas-permeable membrane 5 to the outside 2 over a large temperature range and at the same time ensures excellent pressure equalisation between the inside 1 and the outside 2 during a long service life.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A pressure equalising device for a housing, comprising:
   an inside;
   an outside; and
   a lattice-like cage having a gas passage opening,
   wherein the gas passage opening connects the inside and the outside in a differential pressure-dependent and flow-conducting manner,
   wherein the gas passage opening is covered by a gas-permeable membrane which comprises at least one nonwoven layer,
   wherein the nonwoven layer comprises fibers which are substantially completely sheathed by a sheath of an elastomer, and
   wherein the fibers of the nonwoven layer are each individually and completely sheathed.

2. The pressure equalising device as claimed in claim 1, wherein the elastomer is formed by a fluoroelastomer (FKM) blend.

3. The pressure equalising device as claimed in claim 1, wherein the sheath of the elastomer is formed by an elastomer impregnation.

4. The pressure equalising device as claimed in claim 1, wherein the nonwoven layer has a substantially identical air permeability in a temperature range from −40° C. to +150° C.

5. The pressure equalising device as claimed in claim 1, wherein the nonwoven layer and a further nonwoven layer are arranged in a functional in-series configuration and form a subassembly.

6. The pressure equalising device as claimed in claim 5, wherein the further nonwoven layer is designed as a laminate of nonwoven and expanded polytetrafluoroethylene (ePTFE).

7. The pressure equalising device as claimed in claim 5, wherein the nonwoven layer is arranged on a side of the membrane which faces the inside and the further nonwoven layer is arranged on a side of the membrane which faces the outside.

8. The pressure equalising device as claimed in claim 7, wherein the nonwoven layer and the further nonwoven layer are of substantially congruent design.

9. A housing comprising the pressure equalising device as claimed in claim 1.

10. The housing as claimed in claim 9, wherein the housing encloses electronic components.

11. The pressure equalising device as claimed in claim 1, wherein the nonwoven layer comprises at least a first fiber and a second fiber, wherein the first fiber is sheathed by a first sheath, and wherein the second fiber is sheathed by a second sheath.

12. A pressure equalising device for a housing, comprising:
   an inside;
   an outside; and
   a lattice-like cage having a gas passage opening,
   wherein the gas passage opening connects the inside and the outside in a differential pressure-dependent and flow-conducting manner,
   wherein the gas passage opening is covered by a gas-permeable membrane which comprises at least one nonwoven layer,
   wherein the nonwoven layer comprises fibers which are substantially completely sheathed by a sheath of an elastomer, and
   wherein the nonwoven layer and a further nonwoven layer are arranged in a functional in-series configuration and form a subassembly.

13. The pressure equalising device as claimed in claim 12, wherein the further nonwoven layer is designed as a laminate of nonwoven and expanded polytetrafluoroethylene (ePTFE).

14. The pressure equalising device as claimed in claim 12, wherein the nonwoven layer is arranged on a side of the membrane which faces the inside and the further nonwoven layer is arranged on a side of the membrane which faces the outside.

15. The pressure equalising device as claimed in claim 14, wherein the nonwoven layer and the further nonwoven layer are of substantially congruent design.

16. A pressure equalising device for a housing, comprising:
   an inside;
   an outside; and
   a lattice-like cage having a gas passage opening,
   wherein the gas passage opening connects the inside and the outside in a differential pressure-dependent and flow-conducting manner,
   wherein the gas passage opening is covered by a gas-permeable membrane which comprises at least one nonwoven layer,
   wherein the nonwoven layer comprises fibers which are substantially completely sheathed by a sheath of an elastomer,
   wherein the nonwoven layer comprises at least a first fiber and a second fiber,
   wherein the first fiber is sheathed by a first sheath, and wherein the second fiber is sheathed by a second sheath.

* * * * *